US008297998B2

(12) United States Patent  (10) Patent No.: US 8,297,998 B2
Ju et al.  (45) Date of Patent: Oct. 30, 2012

(54) ELECTRICAL CONNECTOR WITH IMPROVED THRUST MEMBER

(75) Inventors: Ted Ju, Keelung (TW); Zhu Dong Huo, Guangzhou (CN); You Hua Cai, Guangzhou (CN)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 13/183,902

(22) Filed: Jul. 15, 2011

(65) Prior Publication Data

US 2012/0190227 A1  Jul. 26, 2012

(30) Foreign Application Priority Data

Jan. 24, 2011  (CN) ...................... 2011 2 0023080 U

(51) Int. Cl.
*H01R 13/625* (2006.01)
(52) U.S. Cl. ....................................... 439/342; 439/259
(58) Field of Classification Search .................. 439/259, 439/264, 265, 266, 268, 342
See application file for complete search history.

(56) References Cited

U.S. PATENT DOCUMENTS

| 6,500,019 | B1 * | 12/2002 | Tan ............................. 439/342 |
| 7,056,140 | B1 * | 6/2006 | Jiang ........................... 439/342 |
| 7,108,536 | B2 * | 9/2006 | Yu et al. ...................... 439/342 |
| 7,563,120 | B1 * | 7/2009 | Jin ............................... 439/342 |
| 7,753,707 | B1 * | 7/2010 | Ju ............................... 439/342 |

* cited by examiner

*Primary Examiner* — Thanh Tam Le
(74) *Attorney, Agent, or Firm* — Morris Manning & Martin LLP; Tim Tingkang Xia, Esq.

(57) ABSTRACT

An electrical connector includes: an insulating base with a perforation; an insulating cover with a through hole and two slots recessed from a top surface, covered on and capable of sliding relative to the insulating base; a thrust member, disposed on the top surface of the insulating cover, has a body accommodated in the through hole, the body comprises an axial pushing hole, a plate portion respectively extending from two sides of the body and accommodated in the corresponding recessed slots; and a cam, having a driving portion above the body and a shaft extending downwards from the driving portion, at least one interference portion projects from a periphery at a lower end of the shaft and fixed near a bottom of the insulating base, the shaft passes through the axial pushing hole and the perforation.

9 Claims, 4 Drawing Sheets

ELECTRICAL CONNECTOR WITH IMPROVED THRUST MEMBER

CROSS-REFERENCE TO RELATED APPLICATIONS

This non-provisional application claims priority under 35 U.S.C. §119(a) on Patent Application No. 201120023080.4 filed in China on Jan. 24, 2011, the entire contents of which are hereby incorporated by reference.

FIELD OF THE INVENTION

The present invention relates to an electrical connector, and more particularly to an electrical connector for electrically connecting a chip module to a circuit board.

BACKGROUND OF THE INVENTION

A central processing unit (CPU) of a computer is basically positioned on a mother board by an electrical connector, and the electrical connector has two forms.

In one form, a handle is disposed on one side of the electrical connector, and the handle is used to push a cover of the connector, so that the cover and a base of the electrical connector position the CPU by means of staggered clamping, which is generally referred to as a zero-insertion-force connector. That is, when numerous pins on a bottom surface of the CPU are inserted, no resistance is generated between the pins and the base, so that the CPU can be quickly connected to the connector.

In the other form, a cam is used. A rotary lower end of the cam is pivotably mounted on the base, and an upper end of the cam projects out of the cover. A middle section of the cam may be received in a pivot hole of the cover. When a protruding portion of the cam rotates to thrust the pivot hole, the cover is pushed to move.

However, in practical operation, the electrical connector adopting the cam has deficiencies. Since the cam is disposed at a middle position on one side of the base, the cam mainly exerts a pushing force at a middle point to drive a bottom surface of the cover to move at a single point. When the cam rotates, the counter force is completely borne by the base. In addition, the number of the pins of the CPU has currently been up to more than one hundred, and if each pin exerts a counter force, there will be a hundred times of the counter force. Further, the friction between the cover and the base needs to be overcome as well. As a result, it is difficult to push the cover to move, and the force-receiving point of the base is easily broken. Relevant technologies have been disclosed in U.S. Pat. Nos. 6,116,936, 6,247,953, 6,338,640, 6,338,646, and 6,340,309.

Therefore, a heretofore unaddressed need exists in the art to address the aforementioned deficiencies and inadequacies.

SUMMARY OF THE INVENTION

In one aspect, the present invention is directed to an electrical connector, in which a rotation force of the cam is transmitted to a plate portion of a thrust member through a shaft and then transmitted to an insulating cover through the plate portion, thereby distributing the force and reducing the risk of breaking at the perforation of the insulating base.

In one embodiment, the present invention provides an electrical connector that includes: an insulating base, having one end defined with a first driving region where a perforation is formed; an insulating cover, covered on the insulating base and capable of sliding relative to the insulating base, in which one end of the insulating cover is defined with a second driving region corresponding to the first driving region, the second driving region is opened with a through hole corresponding to the perforation, two slots are recessed from a top surface of the second driving region, and the slots are respectively located on two sides of the through hole; a thrust member, disposed on the second driving region from a top surface of the insulating cover, in which the thrust member has a body accommodated in the through hole, the body has an axial pushing hole corresponding to the through hole, the thrust member further has a plate portion respectively extending from two sides of the body, and the plate portions are accommodated in the corresponding slots; and a cam, having a driving portion located above the body and a shaft extending downwards from the driving portion, in which at least one interference portion projects from a periphery of a lower end of the shaft, the shaft passes through the axial pushing hole and the perforation in sequence, and the interference portion is fixed near a bottom of the insulating base.

Compared with the prior art, in the electrical connector in one embodiment of the present invention, since the two plate portions extend from the two sides of the body of the thrust plate, the counter force suffered by the cam can be transmitted to the insulating cover through the two plate portions, thereby reducing the risk of breaking at the perforation of the insulating cover.

When the cam rotates to push the insulating cover to slide relative to the insulating base, the shaft also generates an urging force on the insulating base so as to enable the insulating cover to slide relative to the insulating base. Since the interference portion projects from the periphery of the lower end of the shaft and the interference portion is fixed near the bottom of the insulating base, the contact area between the shaft and the urged object is increased, thereby reducing the urging force and reducing the risk of damage to the insulating base.

In addition, the thrust member is disposed to modify the original mode of pushing a plane to move through a point into indirect linear pushing, and the insulating cover has the slots for accommodating the plate portions, thereby reducing the overall height of the electrical connector.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
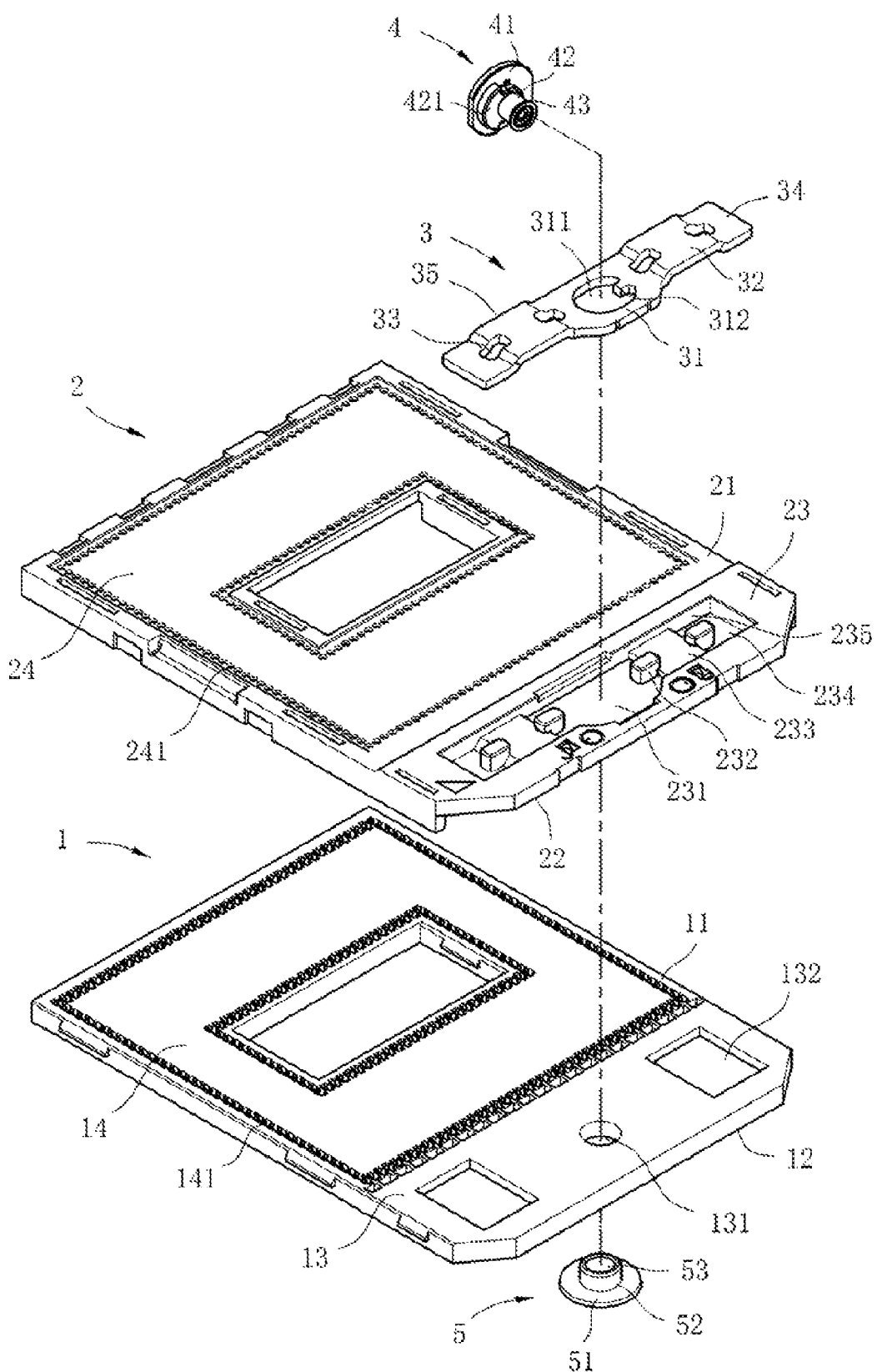
FIG. 1 is an exploded view of an electrical connector in one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

Referring to FIG. 1, the electrical connector in one embodiment of the present invention is used for electrically connecting a chip module (not shown) to a circuit board (not marked) and includes an insulating base 1, an insulating cover 2, a thrust member 3, a cam 4 and a rivet member 5.

Referring to FIG. 1, the insulating base 1 has an upper surface 11 and a lower surface 12 opposite to the upper surface 11. One end of the insulating base 1 is defined with a first driving region 13 and the opposite other end is defined with a conductive region 14. The conductive region 14 accounts for most of the area of the insulating base 1.

The conductive region 14 has a plurality of terminal receiving holes 141 arranged in matrix and formed through the upper surface 11 and the lower surface 12. Each terminal receiving hole 141 accommodates one terminal (not shown) to serve as a medium to achieve the electrical conduction between the chip module and the circuit board.

A perforation 131 formed through the upper surface 11 and the lower surface 12 is disposed substantially at a middle position of the first driving region 13. The first driving region 13 has a notch 132 respectively recessed from the upper surface 11 on two sides of the perforation 131. The first driving region 13 has an accommodating space (not marked) recessed from the lower surface 12 along the periphery of the perforation 131, and the accommodating space is connected with the perforation 131.

Figure 2:
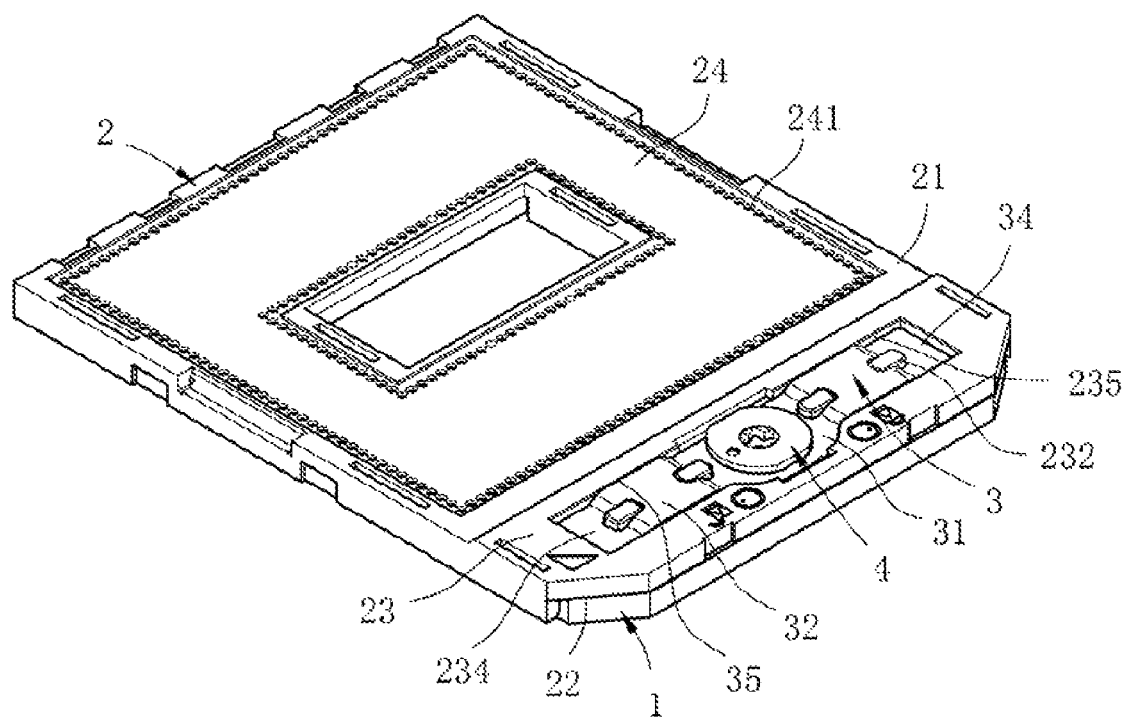
FIG. 2 is an assembled view of the electrical connector in one embodiment of the present invention.

Referring to FIG. 1 and FIG. 2, the insulating cover 2 is covered on the insulating base 1 and is capable of sliding relative to the insulating base 1. The insulating cover 2 has a top surface 21 and a bottom surface 22 opposite to the top surface 21. The bottom surface 22 of the insulating cover 2 is disposed facing the upper surface 11 of the insulating base 1. One end of the insulating cover 2 is defined with a second driving region 23 corresponding to the first driving region 13 and the other end is defined with an insertion region 24 corresponding to the conductive region 14. The insertion region 24 accounts for most of the area of the insulating cover 2.

The insertion region 24 is provided with a plurality of insertion holes 241 formed through the top surface 21 and the bottom surface 22 corresponding to the terminal receiving holes 141 therebelow, for numerous pins (not shown) of the chip module to pass through to enter the corresponding terminal receiving holes 141 therebelow. When the insulating cover 2 is in a closed state relative to the insulating base 1, the pins in the terminal receiving holes 141 are conducted with the terminals.

Figure 6:
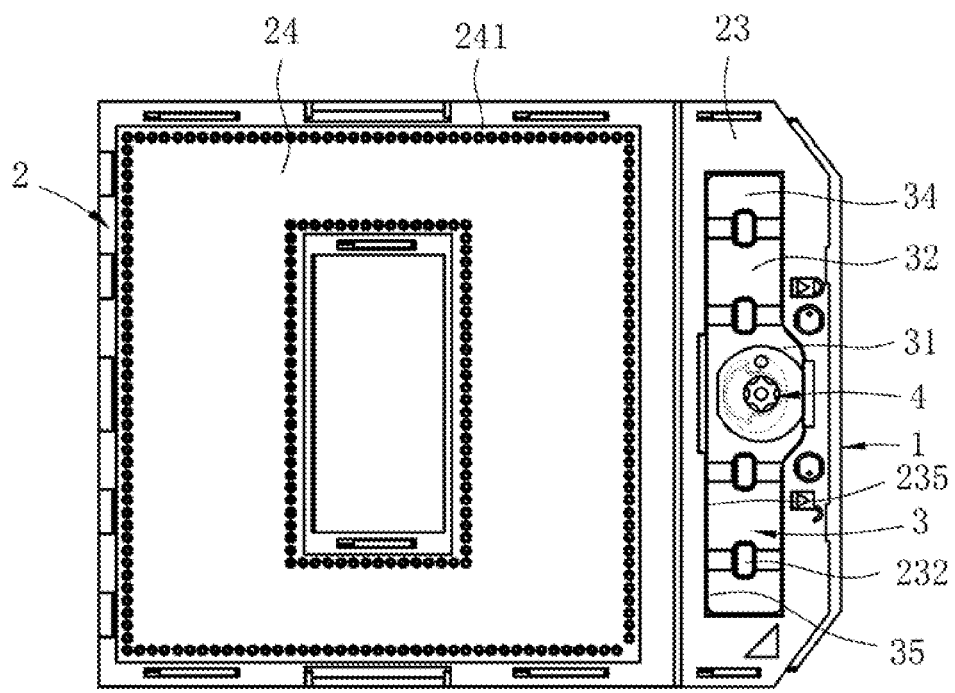
FIG. 6 is a schematic view of the cam of the electrical connector in one embodiment of the present invention in a closed and stopped state.
Figure 7:
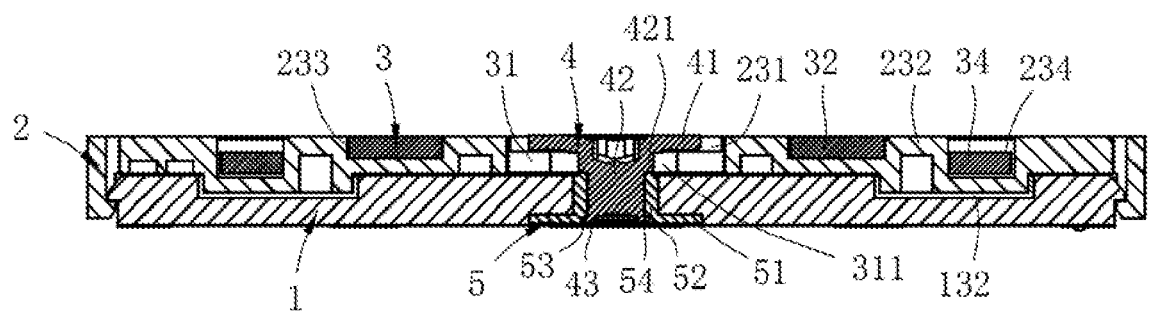
FIG. 7 is a sectional view of the cam of the electrical connector in one embodiment of the present invention after being riveted.

The top surface 21 of the second driving region 23 is higher than the top surface 21 of the insertion region 24. The second driving region 23 has a through hole 231 formed through the top surface 21 and the bottom surface 22 corresponding to the perforation 131, and a positioning post 232 respectively projects from inner edges of two opposite sides of the through hole 231. The sliding directions of the positioning post 232 and the insulating cover 2 relative to the insulating base 1 are perpendicular to each other. The positioning post 232 is not higher than the top surface 21 of the second driving region 23. The second driving region 23 further has two slots 233 and two recessed portions 234 recessed from the top surface 21 of the second driving region 23, and bottom inner wall surfaces of the recessed portions 234 are lower than bottom inner wall surfaces of the slots 233. The recessed portions 234, the slots 233 and the through hole 231 are connected with one another. One of the slots 233 and one of the recessed portions 234 are located on one side of the through hole 231, and one of the slots 233 and one of the recessed portions 234 are located on the opposite other side of the through hole 231. The slots 233 are closest to the through hole 231. A positioning post 232 projectes from the recessed portion 234. A bottom inner wall of the recessed portion 234 is accommodated in the corresponding notch 132 (as shown in FIG. 6 and FIG. 7). The two slots 233, the two recessed portions 234 and the through hole 231 form a first pushing surface 235 on an inner wall surface in the sliding direction of the insulating cover 2.

Figure 3:
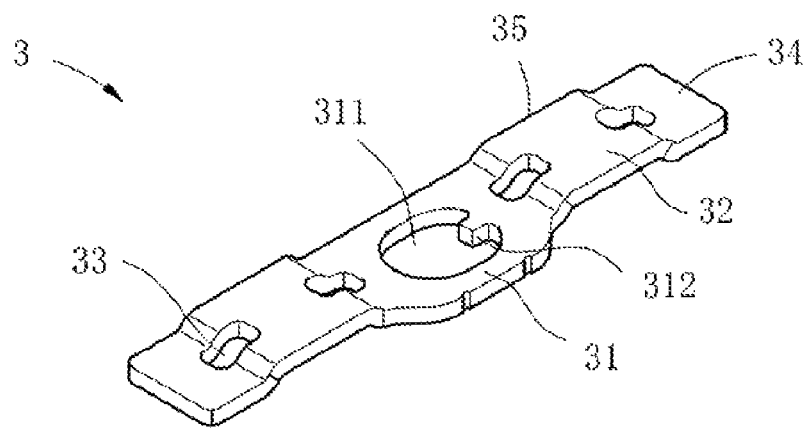
FIG. 3 is a schematic view of a thrust member of the electrical connector in one embodiment of the present invention.
Figure 4:
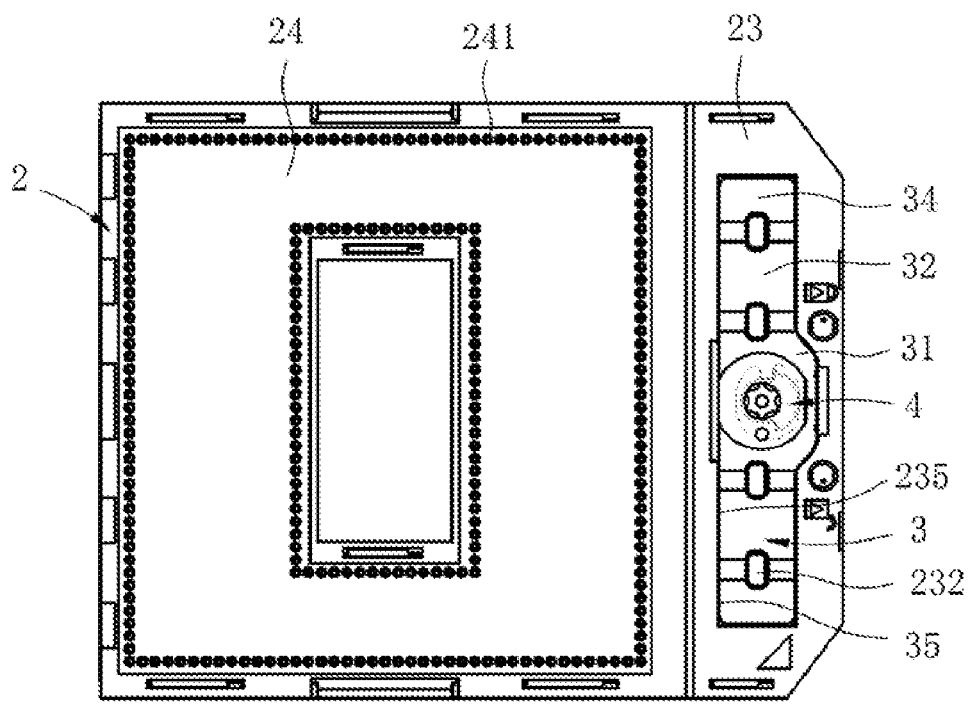
FIG. 4 is a top view of the electrical connector in one embodiment of the present invention in an open state.

Referring to FIG. 1 to FIG. 3, the thrust member 3 is made of a metal material and is disposed on the second driving region 23 from the top surface 21 of the insulating cover 2. The thrust member 3 has a body 31 accommodated in the through hole 231. The body 31 has an axial pushing hole 311 corresponding to the through hole 231. A stopper portion 312 is disposed on the inner edge of the axial pushing hole 311 and is used for stopping excessive rotation of the cam 4. The thrust member 3 further has a plate portion 32 respectively bent and extending from two sides of the body 31 and accommodated in the corresponding slot 233. A positioning hole 33 is disposed at the bent portion, and the positioning hole 33 and the positioning post 232 cooperate to position the thrust member 3 on the second driving region 23. A top surface of the body 31 is lower than top surfaces of the two plate portions 32. The thrust member 3 further has an extending portion 34 bent and extending from one side of the plate portion 32 in a direction away from the body 31. The positioning hole 33 is disposed at the bent portion and cooperates with the positioning post 232 in the recessed portion 234 for positioning. A top surface of the extending portion 34 is lower than the top surface of the plate portion 32, and the extending portion 34 and the body 31 are substantially located at the same height.

A second pushing surface 35 is formed on an outer wall surface of the thrust member 3 along the sliding direction of the insulating cover 2. When the insulating cover 2 slides relative to the insulating base 1, the pushing force exerted on the thrust member 3 by the cam 4 is transmitted to the first pushing surface 235 through the second pushing surface 35, so as to enable the insulating cover 2 to slide.

The cam 4 has a driving portion 41 located above the body 31 and a shaft 42 extending downwards from the driving portion 41. The shaft 42 passes through the axial pushing hole 311 and the perforation 131. A semicircular-shaped pushing portion 421 is disposed on an outer edge where the shaft 42 and the driving portion 41 are connected. The pushing portion 421 and the axial pushing hole 311 cooperate to enable the insulating cover 2 to slide relative to the insulating base 1. An interference portion 43 projects from the periphery of the surface of a tail end of the shaft 42. The interference portion 43 is in an annular shape, and the interference portion 43 is fixed near the bottom of the insulating base 1. In other embodiments, the number of the interference portion 43 may be multiple, and a clearance is formed between every two interference portions 43.

The rivet member 5 is made of a metal material and has a base portion 51 and a column 52 extending upwards from the base portion 51. The rivet member 5 has a hole 53 formed through the base portion 51 and a middle part of the column 52. The width of the hole 53 in the base portion 51 is greater than the width thereof in the column 52, so that a drop between the two forms a fitting surface 54. The fitting surface 54 and the surface of the interference portion 43 form an interference-fit. The column 52 is located in the perforation 131 and the base portion 51 is located in the accommodating space.

During assembly, referring to FIG. 1, first, the terminals are mounted in the corresponding terminal receiving holes 141 of the insulating base 1.

Then, the insulating cover 2 is covered on the insulating base 1 from the upper surface 11 of the insulating base 1, so that the conductive region 14 corresponds to the insertion region 24, the first driving region 13 corresponds to the second driving region 23, the through hole 231 corresponds to the perforation 131, and the bottom inner walls of the recessed portions 234 enter the notches 132.

Then, the thrust member 3 is mounted on the second driving region 23 from the top surface 21 of the insulating cover 2, so that the body 31 enters the through hole 231, the plate portions 32 enter the slots 233, the extending portions 34 enter the recessed portions 234, and the positioning holes 33 and the positioning posts 232 cooperate to position the thrust member 3 on the second driving region 23.

Then, the cam 4 is mounted. The cam 4 is assembled in front of the insulating base 1 and the insulating cover 2. The interference portion 43 of the cam 4 is upright, and the shaft 42 of the cam 4 passes through the axial pushing hole 311 and the perforation 131. The driving portion 41 is located above the body 31.

At last, the column 52 of the rivet member 5 is mounted upwardly in the perforation 131, so that the base portion 51 is located in the accommodating space, the hole 53 contains the shaft 42, and the pushing portion 421 is located in the axial pushing hole 311. Then, a tool is used to rivet the interference portion 43, so that the surface of the interference portion 43 and the fitting surface 54 are in interference-fit, so as to connect the insulating cover 2 and the insulating base 1 to form a unity (as shown in FIG. 7).

Figure 5:
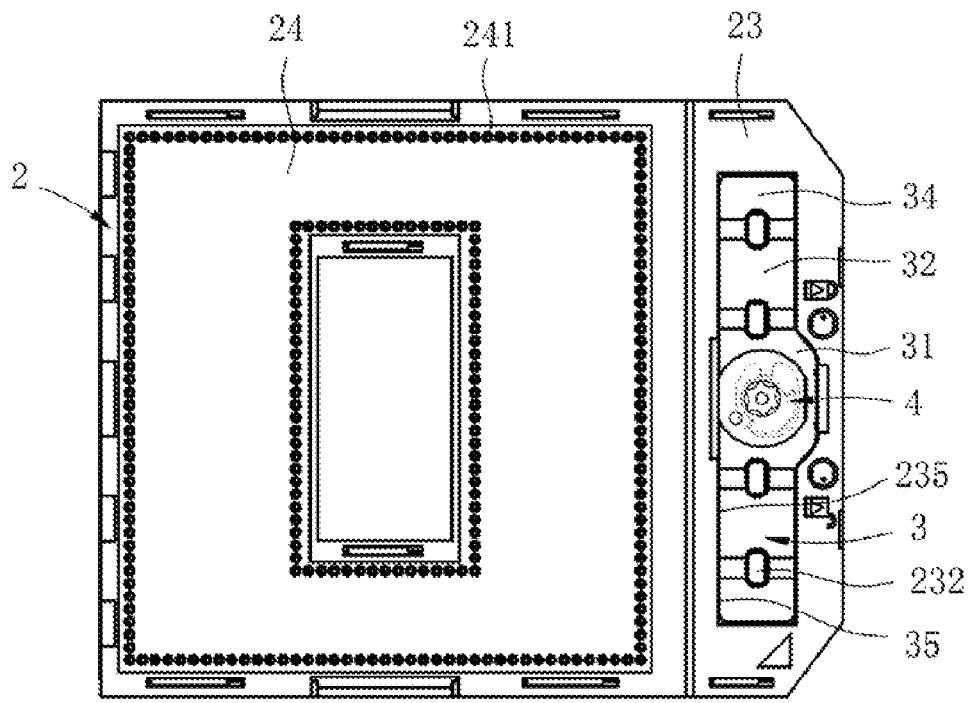
FIG. 5 is a schematic view of a cam of the electrical connector in one embodiment of the present invention during rotation.

Referring to FIG. 4 to FIG. 7, when the electrical connector is soldered onto the circuit board and the chip module is assembled on the insulating cover 2, the pins of the chip module pass through the insertion holes and enter the corresponding terminal receiving holes 141 therebelow. Then, a tool is used to actuate the driving portion 41, so that the shaft 42 drives the pushing portion 421 to urge the inner edge of the axial pushing hole 311 to rotate in a clockwise direction (as shown in FIG. 5). The cam 4 after rotating to a certain degree is stopped by the stopper portion 312, which prevents excessive rotation of the cam 4 (as shown in FIG. 6). Since the interference portion 43 of the cam 4 and the fitting surface 54 of the rivet member 5 are riveted to form the interference-fit, the force when the cam 4 rotates reacts on the shaft 42 through the interference portion 43, and then is transmitted from the shaft 42 to the plate portion 32 and the extending portion 34 of the thrust member 3, and then transmitted to the bottom of the slots 233 accommodating the plate portion 32 and the bottom of the slots 233 accommodated in the extending portion 34, thereby distributing the bearing force and reducing the risk of breaking at the perforation 131 of the insulating cover 2. When the thrust member 3 is pushed forwards, the counter force is transmitted to the first pushing surface 235 through the second pushing surface 35, thereby reducing the deformation of the insulating cover 2.

Furthermore, the positioning holes 33 of the thrust member 3 and the positioning posts 232 of the insulating cover 2 are pushing points in a line, so as to evenly distribute the rotation force exerted by the driving portion 41 to the insulating cover 2 and instantly enable displacement of the insulating cover 2, thereby overcoming the difficulty of pushing in the single-point movement. In addition, since the insulating cover 2 has the slots 233 and the recessed portions 234 for correspondingly accommodating the plate portions 32 and the extending portions 34 of the thrust member 3, the overall height of the electrical connector is reduced.

Based on the above, the electrical connector of the present invention, among other things, has the following beneficial effects.

1. Since the two plate portions extend from the two sides of the body of the thrust plate, the counter force suffered by the cam can be transmitted to the insulating cover through the two plate portions, thereby reducing the risk of breaking at the perforation of the insulating cover.

2. The thrust member is disposed to modify the original mode of pushing a plane to move through a point into indirect linear pushing, so as to evenly distribute the rotation force exerted by the driving portion to the insulating cover and instantly enable displacement of the insulating cover, thereby overcoming the difficulty of pushing in the single-point movement.

3. Since the insulating cover has the slots for accommodating the plate portions, the overall height of the electrical connector is reduced.

4. When the cam rotates to push the insulating cover to slide relative to the insulating base, the shaft also generates an urging force on the insulating base so as to enable the insulating cover to slide relative to the insulating base. Since the interference portion projects from the periphery of the lower end of the shaft, the interference portion is in an annular shape, the interference portion is fixed in the hole, and the surface of the interference portion and the fitting surface form the interference-fit, the contact area between the shaft and the fitting surface is increased, thereby reducing the urging force and reducing the risk of damage to the insulating base.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
   (a) an insulating base, having one end defined with a first driving region where a perforation is formed;
   (b) an insulating cover, covered on the insulating base and capable of sliding relative to the insulating base, wherein one end of the insulating cover is defined with a second driving region corresponding to the first driving region, the second driving region is opened with a through hole corresponding to the perforation, two slots are recessed from a top surface of the second driving region, and the slots are respectively located on two sides of the through hole;
   (c) a thrust member, disposed on the second driving region from the top surface of the second driving region, wherein the thrust member has a body accommodated in the through hole, the body has an axial pushing hole corresponding to the through hole, the thrust member further has two plate portions respectively extending from two sides of the body, the plate portions are accommodated in the corresponding slots, and a top surface of the body is lower than top surfaces of the two plate portions, and wherein lateral edges of the body and the plate portions are substantially against inner edges of the through hole and the slots of the insulating cover in the sliding direction of the insulating cover; and
   (d) a cam, having a driving portion located above the body and a shaft extending downwards from the driving portion, wherein at least one interference portion projects from a periphery of a lower end of the shaft, the shaft passes through the axial pushing hole and the perforation in sequence, and the interference portion is fixed near a bottom of the insulating base.

2. The electrical connector according to claim 1, wherein a stopper portion is disposed on an inner edge of the axial pushing-hole and is used for stopping excessive rotation of the cam.

3. The electrical connector according to claim 1, wherein an extending portion is bent and extends from one side of each plate portion of the thrust member in a direction away from the body, and a recessed portion for accommodating the extending portion is correspondingly disposed in the second driving region.

4. The electrical connector according to claim 3, wherein a bottom inner wall of the recessed portion is lower than bottom inner walls of the slots.

5. The electrical connector according to claim 3, wherein a top surface of the extending portion is lower than a top surface of the plate portion.

6. The electrical connector according to claim 1, wherein the plate portion is bent and extends from the body, a positioning hole is formed at where the plate portion is bent, and a positioning post is disposed on an inner edge of the through hole corresponding to the positioning hole.

7. The electrical connector according to claim 1, further comprising a rivet member, wherein the rivet member has a base portion, a column extending upwards from the base portion and a hole formed through the base portion and the column, and the column is located in the perforation and is riveted to the shaft.

8. The electrical connector according to claim 7, wherein a width of the hole in the base portion is greater than a width thereof in the column, so that a drop between the two forms a fitting surface, and a surface of the interference portion and the fitting surface form an interference-fit.

9. The electrical connector according to claim 7, wherein a semicircular-shaped pushing portion is disposed at an outer edge where the shaft and the driving portion are connected, and the pushing portion and the axial pushing hole cooperate to enable the insulating cover to slide relative to the insulating base.

* * * * *